US009391177B1

(12) United States Patent  
Ma et al.

(10) Patent No.: US 9,391,177 B1  
(45) Date of Patent: Jul. 12, 2016

(54) METHOD OF FABRICATING SEMICONDUCTOR STRUCTURE

(71) Applicant: UNITED MICROELECTRONICS CORPORATION, Hsinchu (TW)

(72) Inventors: Chu-Ming Ma, Kaohsiung (TW); Chun-Yi Lin, Ji'an Township (TW); Hung-Chi Huang, Tainan (TW); Hsien-Ta Chung, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/825,174

(22) Filed: Aug. 13, 2015

(51) Int. Cl.  
*H01L 21/76* (2006.01)  
*H01L 29/66* (2006.01)  
*H01L 21/8234* (2006.01)  
*H01L 29/49* (2006.01)  
*H01L 21/321* (2006.01)  
*H01L 21/3205* (2006.01)

(52) U.S. Cl.  
CPC ...... *H01L 29/66825* (2013.01); *H01L 21/3212* (2013.01); *H01L 21/32055* (2013.01); *H01L 21/823481* (2013.01); *H01L 29/4925* (2013.01)

(58) Field of Classification Search  
CPC .............................................. H01L 29/42352  
USPC ....................................................... 438/430  
See application file for complete search history.

(56) References Cited

U.S. PATENT DOCUMENTS

| | | | |
|---|---|---|---|
| 6,136,653 A | 10/2000 | Sung | |
| 6,153,472 A | 11/2000 | Ding | |
| 6,171,909 B1 | 1/2001 | Ding | |
| 6,197,637 B1 | 3/2001 | Hsu | |
| 6,200,856 B1 | 3/2001 | Chen | |
| 6,284,597 B1 | 9/2001 | Hong | |
| 6,294,812 B1* | 9/2001 | Ding | H01L 27/11521 257/321 |
| 6,326,263 B1 | 12/2001 | Hsieh | |
| 6,562,681 B2 | 5/2003 | Tuan | |
| 6,713,336 B2 | 3/2004 | Shin | |
| 6,897,116 B2 | 5/2005 | Lee | |
| 8,741,754 B2 | 6/2014 | Lee | |
| 2004/0182815 A1* | 9/2004 | Lee | H01L 21/76224 216/13 |
| 2008/0090353 A1* | 4/2008 | Park | H01L 27/11521 438/264 |
| 2008/0237680 A1 | 10/2008 | Pangal | |

OTHER PUBLICATIONS

K. Shimizu, A Novel High-Density 5F2 NAND STI Cell Technology Suitable for 256Mbit and IGbit Flash Memories, IEDM 97, Dec. 10, 1997, p. 271-p. 274.  
Y. Takeuchi, A Self-Aligned STI Process Integration for Low Cost and Highly Reliable IGbit Flash Memories, 1998 IEEE, Oct. 20, 1998, p. 102-p. 103.

* cited by examiner

*Primary Examiner* — Caridad Everhart  
(74) *Attorney, Agent, or Firm* — Ding Yu Tan

(57) ABSTRACT

The present invention provides a method for improving gate coupling ratio of a flash memory device and a protruding floating gate is formed. First, a substrate having a plurality of isolation structures is formed. Then, a first conductive layer is formed overlaying the substrate. A chemical-mechanical polishing process is performed to planarize the first conductive layer. After that, a portion of the isolation structures is removed, and a second conductive layer is formed overlaying the first conductive layer and the isolation structures. Finally, a lithography process with a photomask can be used to define a mask that covers the first conductive layer and the second conductive layer, and then an insulating layer is deposited overlaying the substrate, so that a third conductive layer is formed overlaying the insulating layer.

14 Claims, 11 Drawing Sheets

METHOD OF FABRICATING SEMICONDUCTOR STRUCTURE

FIELD OF THE INVENTION

The invention relates to a method of fabricating a semiconductor structure, and more particularly to a method of fabricating a protruding floating gate of flash memory.

BACKGROUND OF THE INVENTION

Flash memory cells are often bulky and difficult to fabricate in a desirable space due to complex geometries of the multiple gate layers used to form the control and floating gates. Accordingly, flash memory cells cannot generally be integrated as compact as other types of memory devices.

It is the general trend in the semiconductor market to manufacture devices with miniaturized dimensions, lower operation voltage, lower cost, higher speed, etc. The gate coupling ratio (GCR) between the floating gate and the control gate affects the operating voltage and device speed. The read/write method of a flash memory is affected by means of electrons transferring between the floating gate and the source/drain gate. Generally, the larger a gate coupling ratio between the floating gate and the control gate is, the lower required working voltage for operation will be. If floating gate-floating gate capacitance can be decreased, the interference issue will be suppressed. However, it is difficult to increase the overlapped area between the control gate and the floating gate in the conventional stacked gate structure. Accordingly the invention provides a method to fabricate a protruding floating gate, and the overlapped area between the control gate and floating gate will be increased.

SUMMARY OF THE INVENTION

According to one aspect of the present invention, a method for improving gate coupling ratio of a flash memory device is provided, and a protruding floating gate is formed. First, a substrate having a plurality of isolation structures is formed. Then, a first conductive layer is formed overlaying the substrate. A chemical-mechanical polishing process is performed to planarize the first conductive layer. After that, a portion of the isolation structures is removed, and a second conductive layer is formed overlaying the first conductive layer and the isolation structures. Finally, a lithography process with a photomask can be used to define a mask that covers the first conductive layer and the second conductive layer, and then an insulating layer is deposited overlaying the substrate, so that a third conductive layer is formed overlaying the insulating layer.

In one embodiment of the present invention, the isolation structures are shallow trench isolation (STI) structures.

In one embodiment of the present invention, the step of forming a first conductive layer overlaying the substrate comprises performing a physical vapor deposition (PVD) process or a chemical vapor deposition process (CVD)

In one embodiment of the present invention, the step of removing the portion of the isolation structures comprises performing a wet etching process or a dry etching process.

In one embodiment of the present invention, the step of removing the portion of the isolation structures forms a remained isolation structure having an upper surface lower than an upper surface of the first conductive layer.

In one embodiment of the present invention, the isolation structures comprise insulating materials.

In one embodiment of the present invention, the insulating materials are selected from the group consisting of boro phosphosilicate glass (BPSG), phosophosilicate glass (PSG), CVD oxide, fluorinated glass (FSG) or the like.

In one embodiment of the present invention, the first conductive layer is made of a doped polysilicon layer.

In one embodiment of the present invention, the second conductive layer is made of a doped polysilicon layer.

In one embodiment of the present invention, the step of patterning the second conductive layer further comprises etching and lithography processes.

In one embodiment of the present invention, the insulating layer is an inter-poly dielectric layer.

In one embodiment of the present invention, the first conductive layer and the second conductive layer are collectively formed a floating gate.

In one embodiment of the present invention, the third conductive layer is made of a doped polysilicon layer.

In one embodiment of the present invention, the third conductive layer is a control gate.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

As show in FIGS. 1-4, a silicon-based substrate 10 is provided. Subsequently, a silicon nitride layer 11 is deposited on the silicon-based substrate 10, and a plurality of shallow trench isolation (STI) grooves 12 is formed by lithography process, in which the etching is generally anisotropic. The anisotropic etching, for example, can be plasma etching or reactive ion etching. Then, the grooves 12 in the substrate 10 are filled with suitable materials such as boro phosphosilicate glass (BPSG), phosphosilicate (PSG), CVD oxide, fluorinated glass (FSG), or the other dielectric materials to form a plurality of isolation structures 13.

Figure 1:
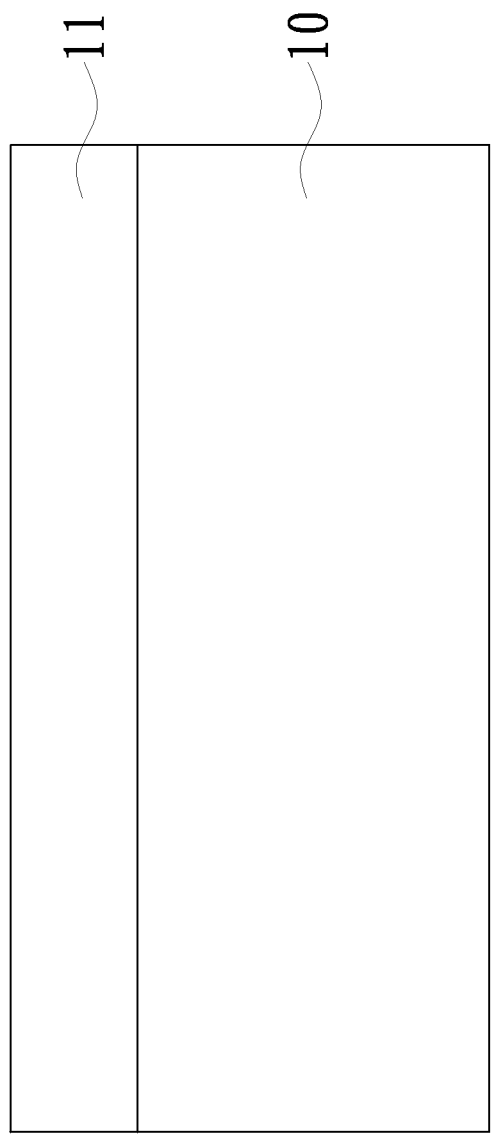
FIGS. 1-11 are schematic cross-sectional views illustrating a method of fabricating a semiconductor structure, and more particularly to a method of fabricating a protruding floating gate of flash memory.
Figure 2:
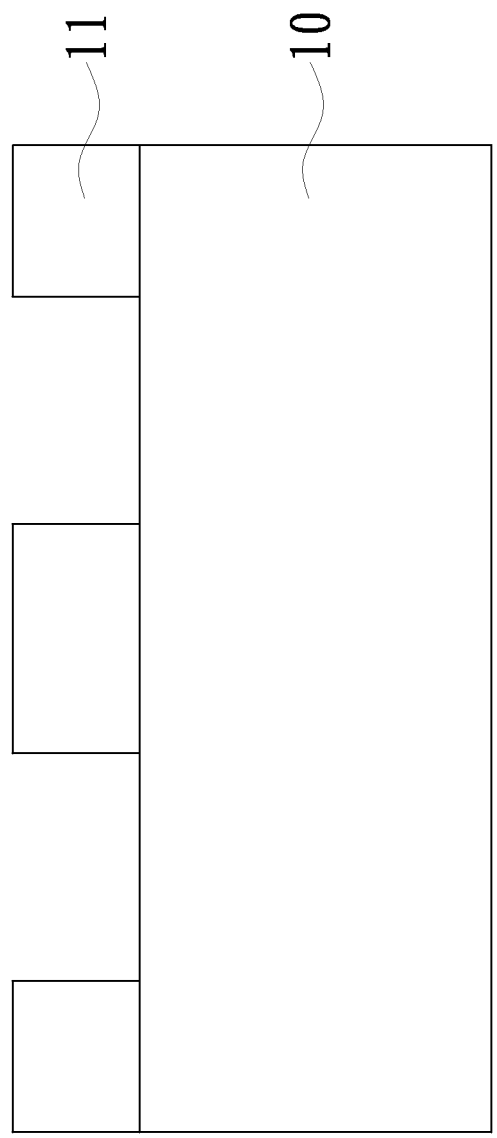
Figure 3:
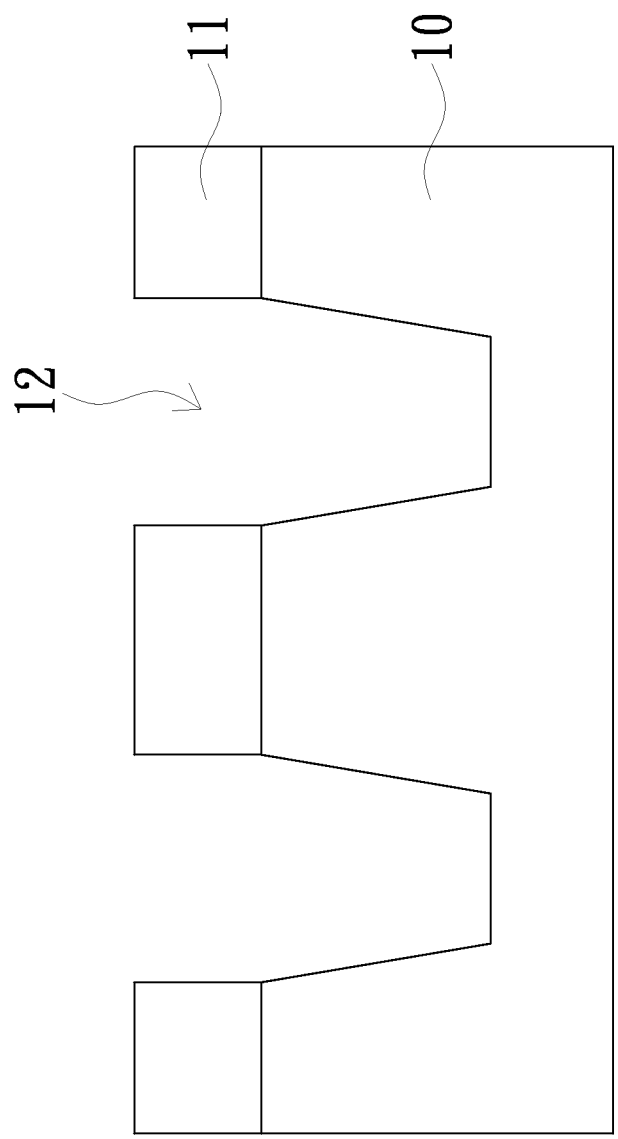
Figure 4:
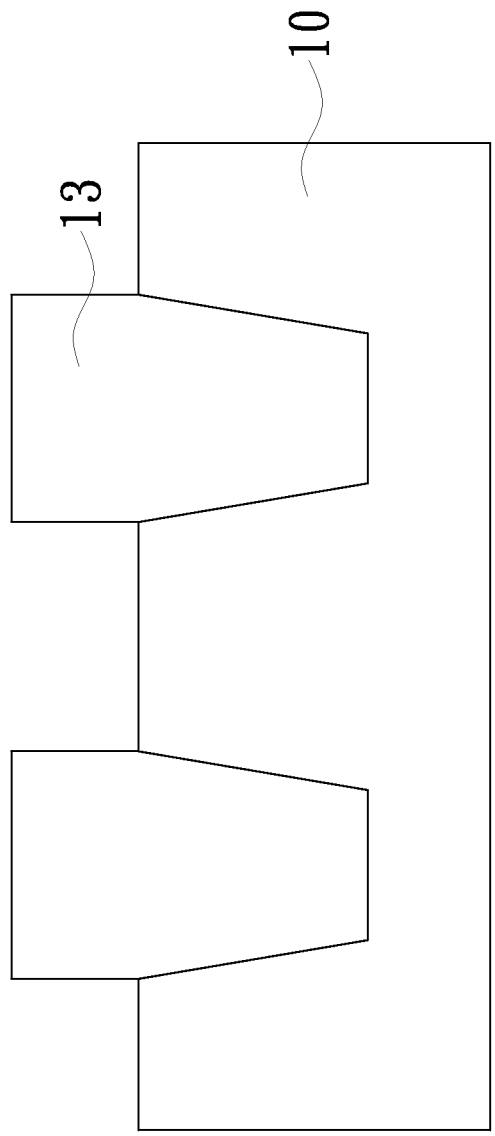
Figure 5:
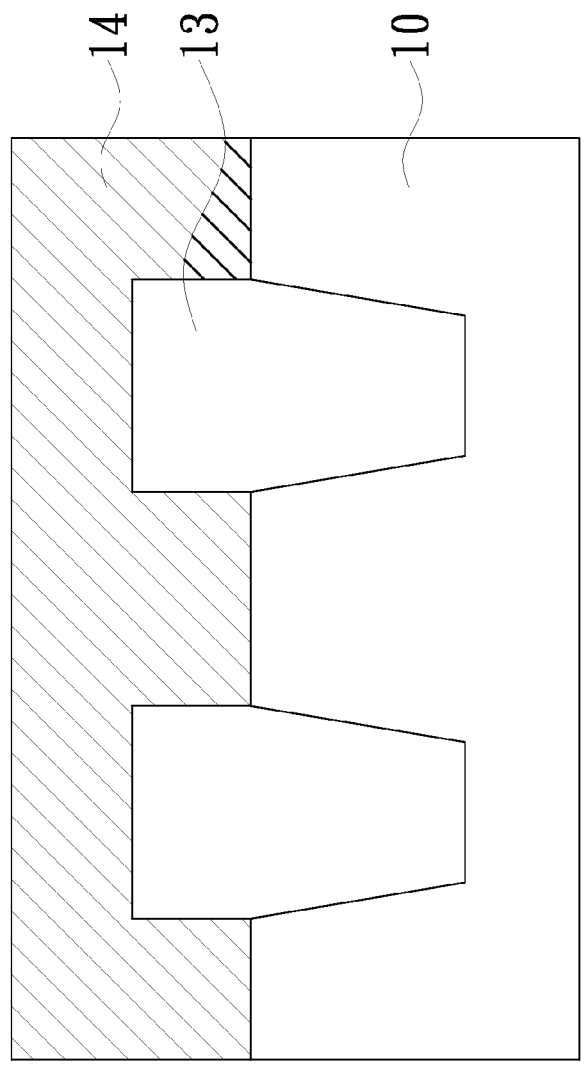

Referring to FIG. 5, a first conductive layer 14 including, but not limited to, doped polysilicon layer, is deposited overlaying the substrate 10 by performing a physical vapor deposition (PVD) process or a chemical vapor deposition process (CVD). The first conductive layer 14, for example, polysilicon layer, can be doped using diffusion (e.g., $POCl_3$), in-situ doping (e.g., $PH_3$), and ion implantation.

Figure 6:
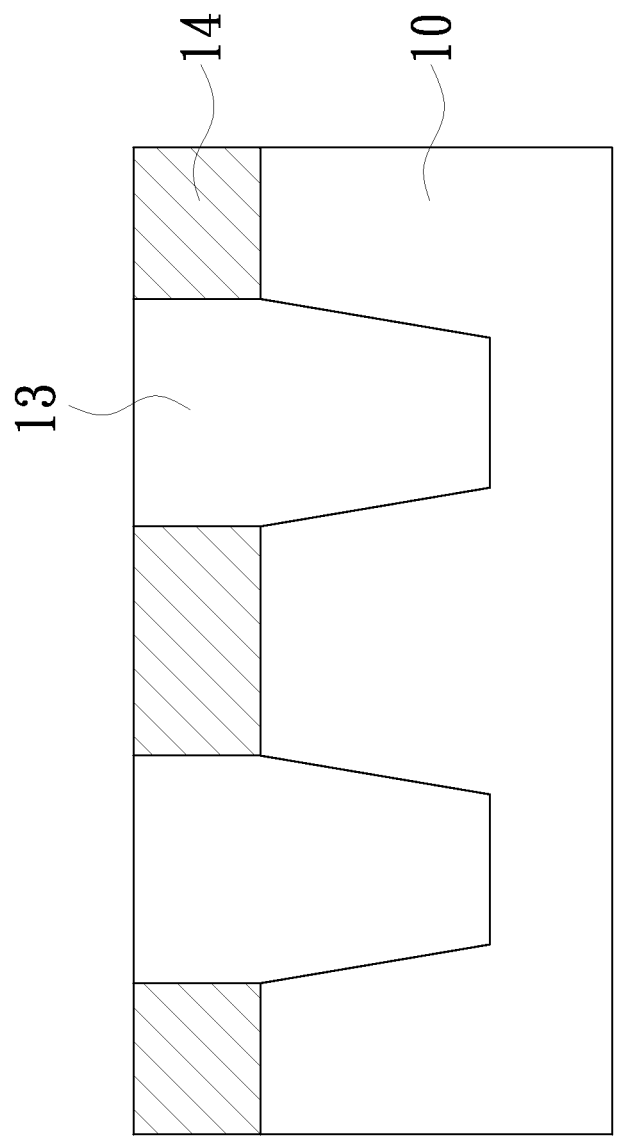

A planarizing step is performed to remove protruding portions of the first conductive layer 14, as shown in FIG. 6. The planarizing step often uses techniques such as chemical mechanical polishing, commonly referred as CMP. The chemical mechanical polishing process uses a selected recipe. This selected recipe can be a slurry including an abrasive material such as a silica material.

Figure 7:
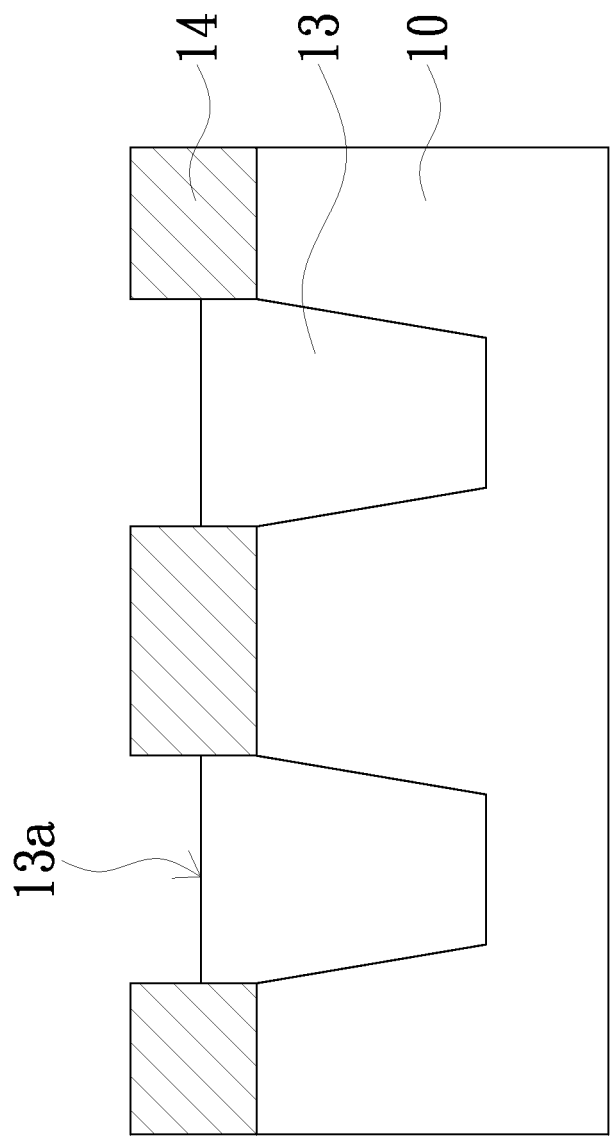

As shown in FIG. 7, the method of fabricating the semiconductor structure undergoes a step of etching back to expose a portion of the isolation structures 13. The etching process includes a wet etching process or a dry etching process. In a specific embodiment, an upper surface of remained isolation structure 13a is lower than an upper surface of the first conductive layer 14.

Figure 8:
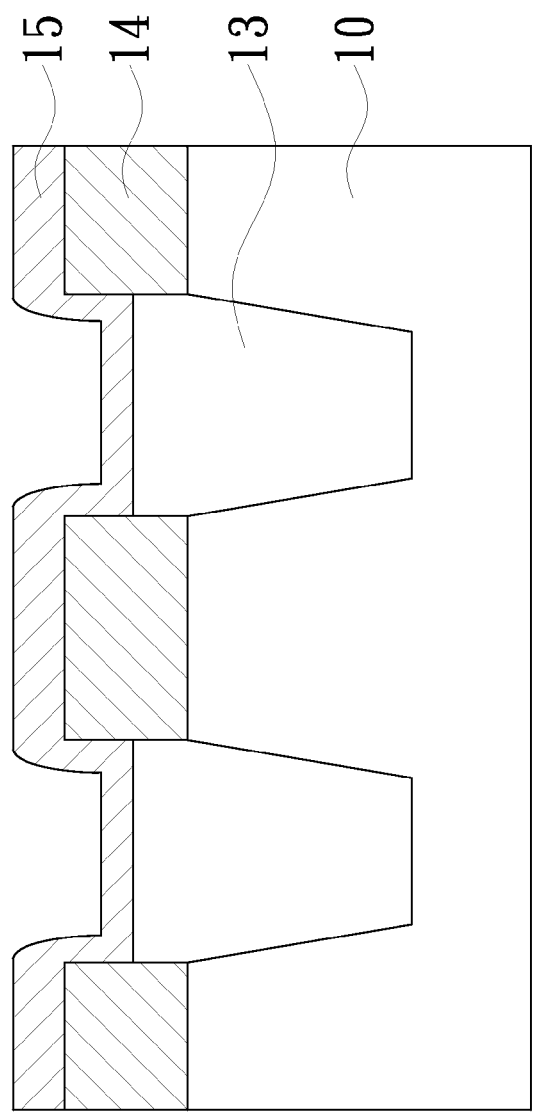

Referring to FIG. 8, a second conductive layer 15 including, but not limited to, doped polysilicon layer, is deposited overlaying the substrate 10 by performing a physical vapor deposition (PVD) process or a chemical vapor deposition process (CVD). The second conductive layer 15, for example, polysilicon layer, can be doped by means of diffusion (e.g., $POCl_3$), in-situ doping (e.g., $PH_3$), and ion implantation.

Figure 9:
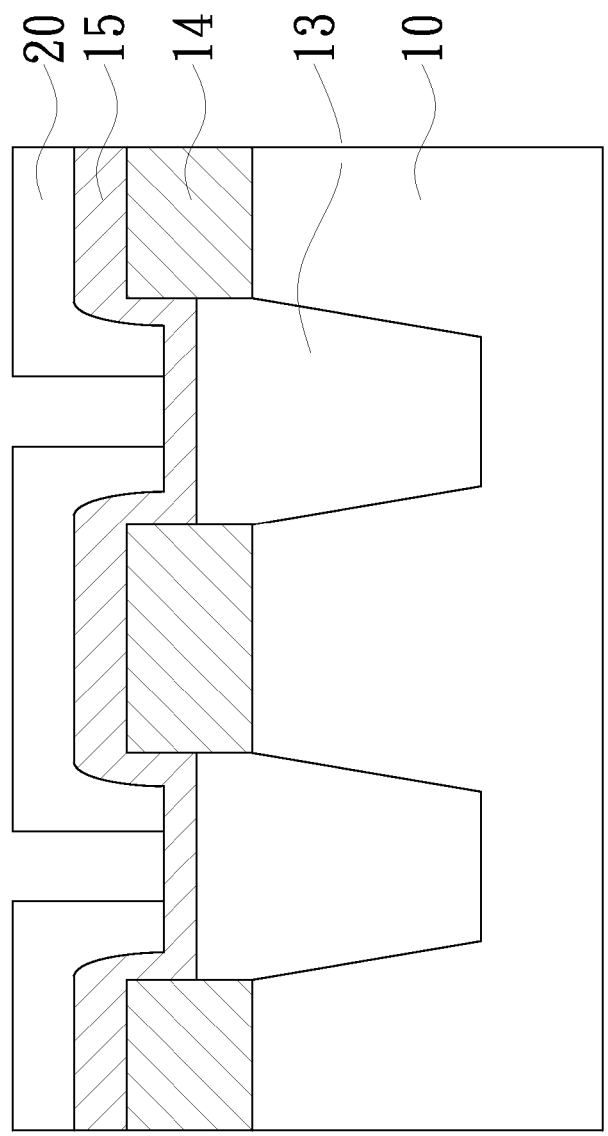

Referring to FIG. 9, a masking layer is defined overlaying the second conductive layer 15. The masking layer can be made of any suitable materials that can withstand subsequent etching processes to be performed. The masking layer is patterned by means of a variety of techniques, including photolithography. The patterned masking layer 20 forms exposed regions of the second conductive layer 15. After that, a step of etching occurs to remove the exposed regions of the second conductive layer 15. The etching is generally anisotropic and can be applied to the techniques of such as plasma etching, reactive ion etching, and other processes.

Figure 10:
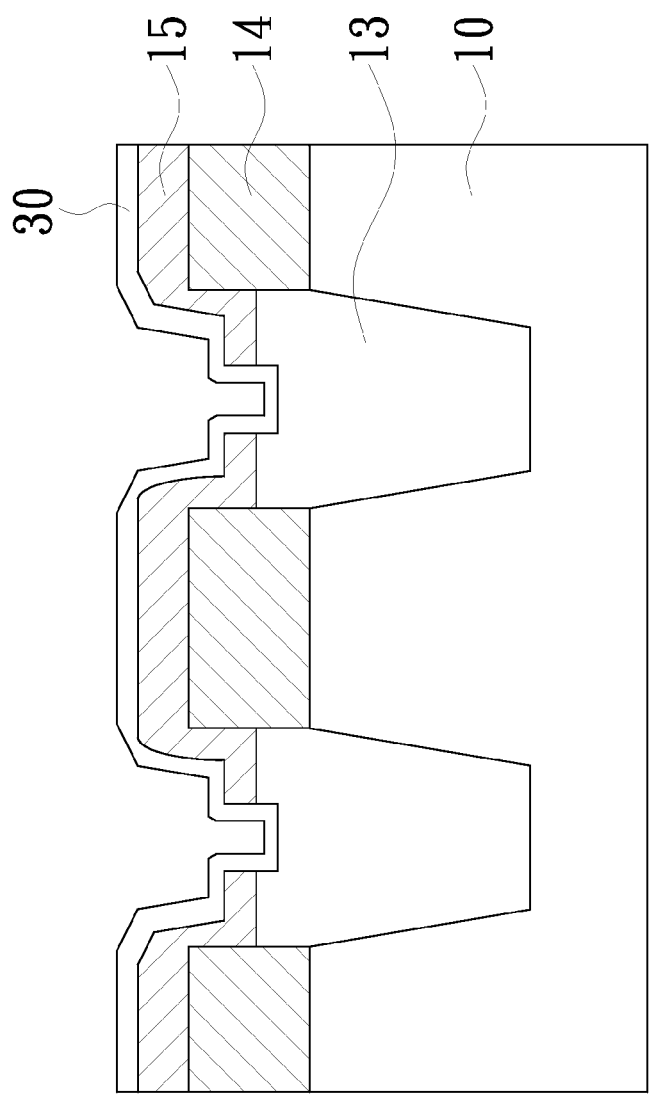

Referring to FIG. 10, after the patterned masking layer 20 being removed, an insulating layer 30, for example, a thin inter-poly dielectric layer, can be deposited overlaying the substrate 10. In a specific embodiment, this invention uses a furnace oxidation process that relies upon steam oxidation to form a dielectric layer such as oxide layer. The types of the dielectric layers depend upon the applications used.

Figure 11:
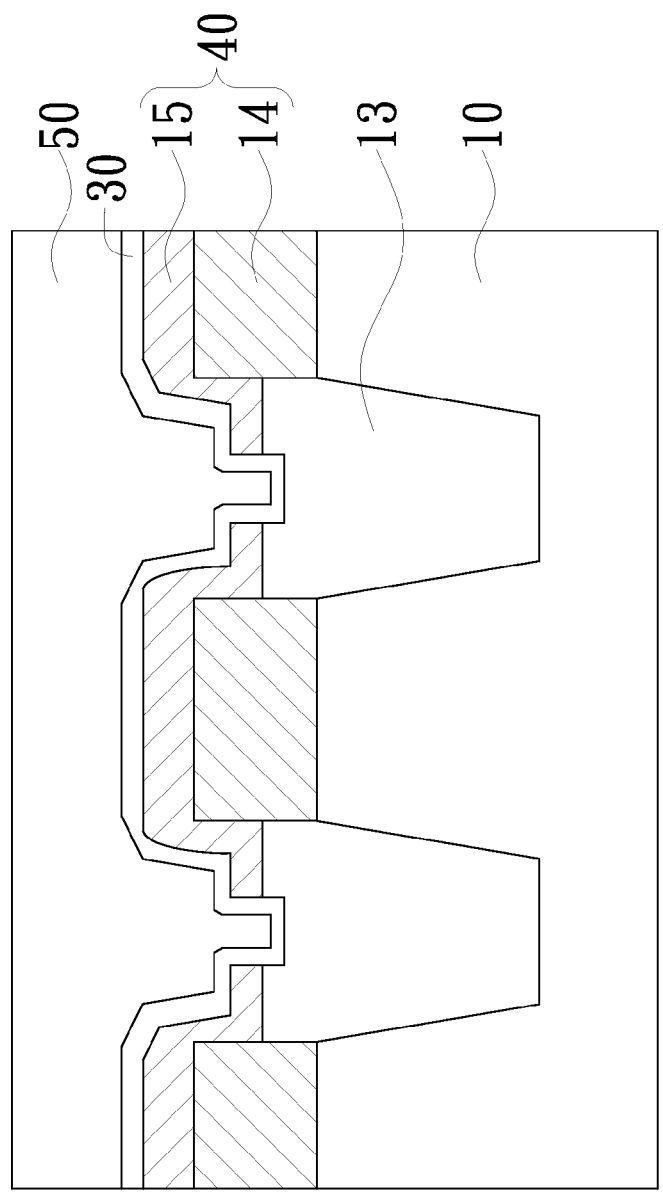

Referring to FIG. 11, a control gate or a third conductive layer 50 including, but not limited to, doped polysilicon layer, is formed overlaying the insulating layer 30, such as a thin inter-poly dielectric layer. The third conductive layer 50 is deposited overlaying the substrate 10 by performing a physical vapor deposition (e.g., PVD) process or a chemical vapor deposition process (CVD). The third conductive layer 50, for example, polysilicon layer, can be doped using diffusion (e.g., $POCl_3$), in-situ doping (e.g., $PH_3$), and ion implantation. The first conductive layer 14 and the second conductive layer 15 are collectively formed a protruding floating gate 40. In a specific embodiment, the first conductive layer, the second conductive layer, and the third conductive layer are made of doped polysilicon.

The gate coupling ratio is increased in this invention, and the interference from one floating gate to the other floating gate can be suppressed. Specifically, there is no need to add any extra lithograph processes.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor structure, comprising the steps of:
   forming a plurality of isolation structures in the substrate;
   forming a first conductive layer overlaying the substrate;
   performing a chemical-mechanical polishing process to planarize the first conductive layer;
   removing a portion of the isolation structures;
   forming a second conductive layer overlaying the first conductive layer and the isolation structures;
   patterning the first conductive layer and the second conductive layer;
   forming an insulating layer overlaying the substrate; and
   forming a third conductive layer overlaying the insulating layer.

2. The method according to claim 1, wherein the isolation structures are shallow trench isolation (STI) structures.

3. The method according to claim 1, wherein the step of forming a first conductive layer overlaying the substrate further comprises a process of performing a physical vapor deposition (PVD) or a chemical vapor deposition process (CVD).

4. The method according to claim 1, wherein the step of removing the portion of the isolation structures further comprises a process of performing a wet etching or a dry etching.

5. The method according to claim 1, wherein the first conductive layer is made of a doped polysilicon layer.

6. The method according to claim 1, wherein the second conductive layer is made of a doped polysilicon layer.

7. The method according to claim 1, wherein the step of patterning the second conductive layer further comprises etching and lithography processes.

8. The method according to claim 1, wherein the insulating layer is an inter-poly dielectric layer.

9. The method according to claim 1, wherein the first conductive layer and the second conductive layer are collectively formed a floating gate.

10. The method according to claim 1, wherein the third conductive layer is made of a doped polysilicon layer.

11. The method according to claim 1, wherein the third conductive layer is a control gate.

12. The method according to claim 1, wherein the step of removing the portion of the isolation structures further comprises a process of forming a remained isolation structure having an upper surface lowered than an upper surface of the first conductive layer.

13. The method according to claim 12, wherein the isolation structures comprise insulating materials.

14. The method according to claim 13, wherein the insulating materials are selected from the group consisting of boro phosphosilicate glass (BPSG), phosophosilicate glass (PSG), CVD oxide, fluorinated glass (FSG) or the like.

* * * * *